(12) United States Patent
Johnson

(10) Patent No.: US 7,608,326 B2
(45) Date of Patent: Oct. 27, 2009

(54) THERMALLY CONDUCTIVE EMI SHIELD

(75) Inventor: Richard Norman Johnson, Encinitas, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 333 days.

(21) Appl. No.: 10/531,890

(22) PCT Filed: Oct. 21, 2003

(86) PCT No.: PCT/US03/33353
§ 371 (c)(1),
(2), (4) Date: Nov. 28, 2005

(87) PCT Pub. No.: WO2004/037447
PCT Pub. Date: May 6, 2004

(65) Prior Publication Data
US 2006/0099403 A1    May 11, 2006

Related U.S. Application Data

(60) Provisional application No. 60/419,873, filed on Oct. 21, 2002.

(51) Int. Cl.
B32B 27/00 (2006.01)
B32B 5/16 (2006.01)
B05D 5/12 (2006.01)

(52) U.S. Cl. .............. 428/328; 428/329; 428/423.1; 428/484.1; 427/58; 427/96.1

(58) Field of Classification Search .......... 428/323, 428/325, 328, 329, 336, 423.1, 412
See application file for complete search history.

(56) References Cited

U.S. PATENT DOCUMENTS 4,299,873 A * 11/1981 Ogihara et al. ............. 428/137
4,555,422 A * 11/1985 Nakamura et al. ......... 428/34.9

(Continued)

FOREIGN PATENT DOCUMENTS

| EP | 0945916 | 9/1999 |
|---|---|---|
| EP | 1267601 | 12/2002 |
| JP | 2001348542 | 12/2001 |
| JP | 2001358265 | 12/2001 |
| JP | 2002217342 | 8/2002 |
| WO | WO 02/13315 | 2/2002 |

Primary Examiner—Timothy M Speer
(74) Attorney, Agent, or Firm—Harness, Dickey & Pierce, P.L.C.

(57) ABSTRACT

Electromagnetic-energy absorbing materials are combined with thermally conductive materials, such as those used for thermal management in association with electronic equipment, thereby suppressing the transmission of electromagnetic interference (EMI) therethrough. Disclosed are materials and processes for combining EMI-absorbing materials with thermally conductive materials thereby improving EMI shielding effectiveness in an economically efficient manner. In one embodiment, a thermally conductive EMI absorber is prepared by combining an EMI-absorbing material (for example, ferrite particles) with a thermally conducting material (for example, ceramic particles), each suspended within an elastomeric matrix (for example, silicone). In application, a layer of thermally conductive EMI-absorbing material is applied between an electronic device or component, and a heat sink

43 Claims, 10 Drawing Sheets

MATRIX 130
THERMAL CONDUCTOR 120
EMI ABSORBER 110
THERMAL EMI SHIELD 100

U.S. PATENT DOCUMENTS

| | | | |
|---|---|---|---|
| 5,817,583 A | * 10/1998 | Alderson et al. | 442/38 |
| 5,841,067 A | * 11/1998 | Nakamura et al. | 174/382 |
| 6,090,728 A | * 7/2000 | Yenni et al. | 442/117 |
| 6,852,573 B2 | 2/2005 | Ebihara et al. | |
| 6,890,970 B2 | * 5/2005 | Kawaguchi | 523/137 |
| 2002/0014748 A1 | 2/2002 | McCullough et al. | |

* cited by examiner

THERMALLY CONDUCTIVE EMI SHIELD

This patent application is a U.S. national stage filing under 35 U.S.C. §371 of International Application No. PCT/US2003/33353 filed Oct. 21, 2003, which claims priority to U.S. provisional patent application No. 60/419,873 filed Oct. 21, 2002.

BACKGROUND OF THE INVENTION

1. Field of the Invention

The present invention relates generally to thermal management in electronic applications and, more specifically, to thermal conductors incorporating electromagnetic-energy-attenuating properties.

2. Description of the Prior Art

As used herein, the term EMI should be considered to refer generally to both electromagnetic interference and radio-frequency-interference (RFI) emissions, and the term "electromagnetic" should be considered to refer generally to electromagnetic and radio frequency.

Electronic devices typically generate thermal emissions as an unavoidable byproduct. The amount of thermal emissions generated can correlate to the switching speed and complexity of the source electronic component or device. As newer electronic devices tend to operate at greater and greater switching speeds, they will also result in greater thermal emissions. These increased thermal emissions, at some level, pose a risk of interfering with the function of the source electronic component, and with the functions of other nearby devices and components.

Accordingly, the unwanted thermal emissions should be dissipated benignly to preclude or minimize any undesirable effects. Prior-art solutions addressing the removal of unwanted thermal emissions include providing a thermal pad over the electronic component and attaching a heat sink to the thermal pad. Heat sinks generally include material with high thermal conductivity. When placed in intimate contact with a heat-generating electronic component, the heat sink conducts thermal energy away from the component. Heat sinks also include attributes that facilitate heat transfer from the heat sink to the ambient environment, for example, through convection. For example, heat sinks often include "fins" that result in a relatively large surface area for a given volume.

Furthermore, under normal operation, electronic equipment typically generates undesirable electromagnetic energy that can interfere with the operation of proximately located electronic equipment due to EMI transmission by radiation and conduction. The electromagnetic energy can exist over a wide range of wavelengths and frequencies. To minimize problems associated with EMI, sources of undesirable electromagnetic energy can be shielded and electrically grounded to reduce emissions into the surrounding environment. Alternatively, or additionally, susceptors of EMI can be similarly shielded and electrically grounded to protect them from EMI within the surrounding environment. Accordingly, shielding is designed to prevent both ingress and egress of electromagnetic energy relative to a barrier, a housing, or other enclosure in which the electronic equipment is disposed.

Sound EMI design principles recommend that EMI be treated as near as possible to the source to preclude entry of unwanted EMI into the local environment, thereby minimizing the risk of interference. Unfortunately, components and devices requiring the use of heat sinks are not well suited for protective treatment for EMI at the source, because such treatment would interfere with the operation of the heat sink. The heat sink should be in intimate contact with the electronic component to provide a thermal conduction path and also be open to the surrounding environment to allow for the heat sink to function through convective heat transfer.

SUMMARY OF THE INVENTION

In general, the present invention relates to an electromagnetic-interference-absorbing thermally-conductive gap filler, such as an elastomeric (for example, silicone) pad treated with an electromagnetic-interference-absorbing material. The EMI-absorbing material absorbs a portion of the EMI incident upon the treated thermal pad, thereby reducing transmission of EMI therethrough over a range of operational frequencies. The absorbing material may remove a portion of the EMI from the environment through power dissipation resulting from loss mechanisms. These loss mechanisms include polarization losses in a dielectric material and conductive, or ohmic, losses in a conductive material having a finite conductivity.

Accordingly, in a first aspect, the invention relates to a composite material for reducing electromagnetic emissions generated by an electronic device, the composite material including, in combination, a thermally conductive material and an electromagnetic-energy-absorptive material. The thermally conductive material facilitates transfer of thermal energy from the device and the electromagnetic-energy-absorptive material reduces electromagnetic emissions generated by the device.

In one embodiment, at least one of the thermally conductive material and the electromagnetic-energy-absorptive material are granules. The granules may be generally spherical, such as microspheres, or other shapes, such as powder, fibers, flakes, and combinations thereof. The composite further includes a matrix material in which the thermally conductive material and the electromagnetic-energy-absorptive material are suspended.

In general, the matrix material is substantially transparent to electromagnetic energy, for example, being defined by a relative dielectric constant of less than approximately 4 and a loss tangent of less than approximately 0.1. In one embodiment, the matrix is prepared as a liquid. In another embodiment, the matrix is prepared as a solid. In another embodiment, the-matrix is prepared as a phase-change material existing in a solid phase at ambient room temperature and transitioning to a liquid phase at equipment-operating temperatures. In another embodiment, the matrix is prepared as a thermosetting material.

In some embodiments, the thermally conductive EMI absorber is formed in a sheet having a thickness greater than approximately 0.010 inch and less than approximately 0.18 inch. In other embodiments, the sheet includes a thermoconductive adhesive layer.

In another aspect, the invention relates to a method for reducing electromagnetic emissions produced by a device, the method including the steps of providing a thermally conductive material, providing an electromagnetic-absorbing material, and combining the thermally conductive material with the electromagnetic-absorbing material.

In one embodiment, the process includes the additional step of suspending the combined thermally conductive material and electromagnetic-absorbing material in a matrix material.

In another embodiment, the process includes the additional step of placing the combined thermally conductive material and electromagnetic-absorbing material between the device and proximate structure, such as between an integrated circuit and a heat sink.

BRIEF DESCRIPTION OF THE DRAWINGS

The advantages of the invention may be better understood by referring to the following description, taken in conjunction with the accompanying drawings, in which.

DETAILED DESCRIPTION OF THE INVENTION

Materials having electromagnetic-energy absorbing properties can be used to suppress the transmission of EMI over a broad range of frequencies. Such EMI-absorbing materials can provide substantial electromagnetic-shielding effectiveness, for example, up to about 5 dB or more at EMI frequencies occurring from about 2 GHz up to about 100 GHz.

According to the present invention, a thermally-conductive EMI absorber can be formed by combining EMI-absorbing fillers and thermally conducting fillers in a base matrix (for example, an elastomer) capable of being applied as a thermal gap filler, or pad. Generally, the resulting thermally-conductive EMI absorber can be applied as any thermal conductive material, for example, as between an electronic component (e.g., a "chip") and a heat sink.

Figure 1:
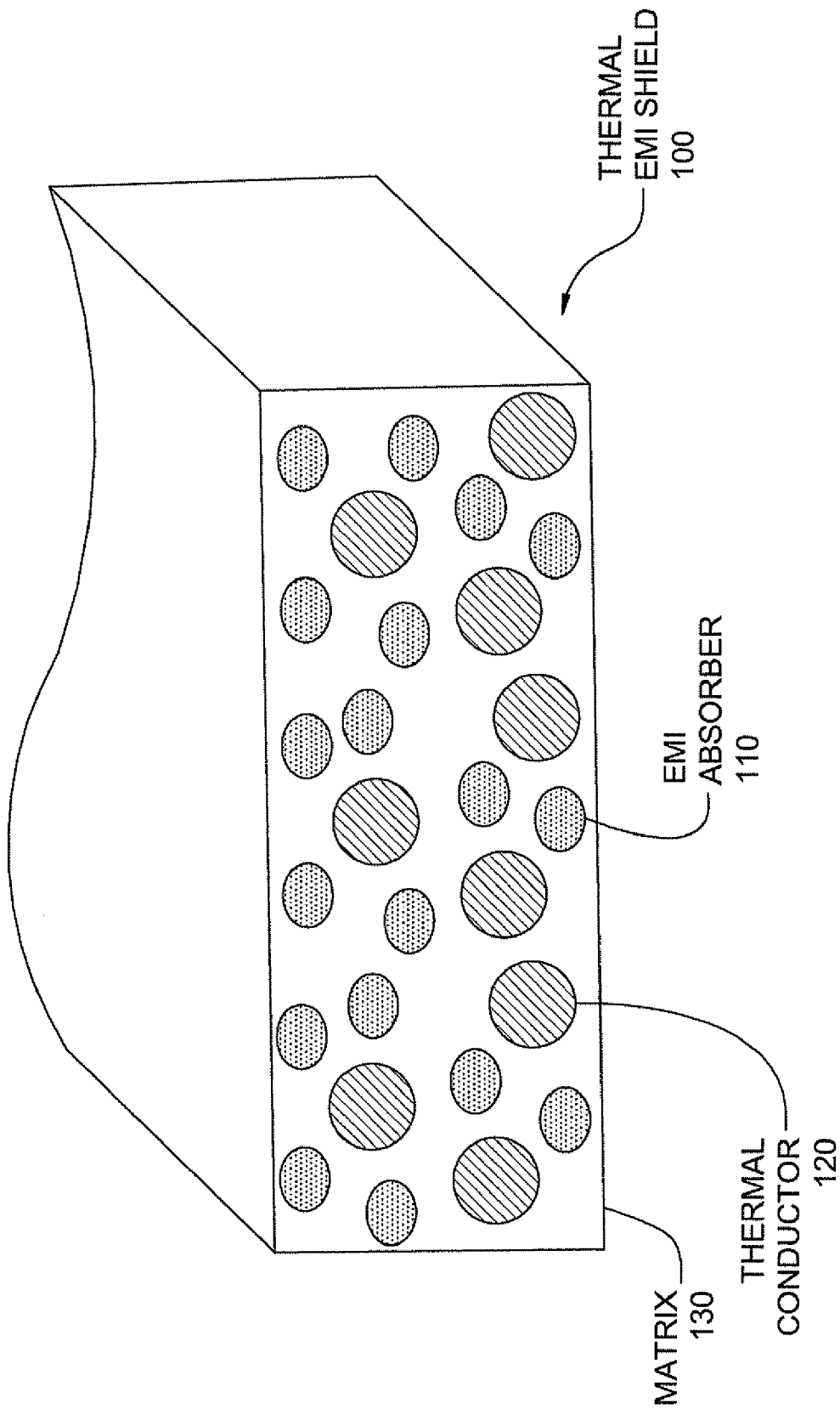
FIG. 1 is a schematic diagram depicting a perspective view of an embodiment of a thermally conductive EMI absorber identifying exemplary constituent components.

Referring to FIG. 1, a thermally-conductive EMI absorber (thermal EMI shield) 100 is illustrated as a rectangular volume. The front face of the thermal EMI shield 100 represents a cross-sectional view of the interior composition of the shield 100. Namely, the thermal EMI shield 100 includes a number of EMI absorbers 110 and a number of thermal conductors 120, both being suspended within a matrix material 130. Although none of the EMI absorber particles 110 and the thermal conductor particles 120 are illustrated as being in contact with any neighboring particles 110,120, configurations in which such contact occurs are anticipated. For example, thermal conductivity of the thermal EMI shield 100 would generally be enhanced for configurations in which thermal conductor particles 120 are in close proximity and contact with each other.

The relative sizes of the individual EMI absorbers 110, thermal conductors 120, and the thickness of the matrix 130 as shown in FIG. 1 are for illustration purposes only. In general, the suspended fillers 110,120 are extremely small (that is, microscopic). Small filler particles 110,120 allow for embodiments in which the overall thickness of the thermal EMI shield 100 is thin, for example, the thickness of the thermal EMI shield 100 is substantially less than the thickness of either the electronic component/device or the heat sink.

Similarly, the relative shapes of the suspended particles 110,120 can be any arbitrary shape. The elliptical shapes of the suspended particles 110,120 shown in FIG. 1 are for illustration purposes only. In general, the shape of the suspended particles 110,120 can be granules, such as spheroids, ellipsoids, or irregular spheroids. Alternatively, the shape of the suspended particles 110,120 can be strands, flakes, a powder, or combinations of any or all of these shapes.

The EMI absorbers 110 function to absorb electromagnetic energy (that is, EMI). Specifically, the EMI absorbers 110 convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within an EMI absorber 110 having a finite conductivity. The finite conductivity results in a portion of the induced current generating heat through a resistance. Dielectric losses refer to a reduction in EMI resulting from the conversion of electromagnetic energy into mechanical displacement of molecules within an absorber 110 having a non-unitary relative dielectric constant. Magnetic losses refer to a reduction in EMI resulting from the conversion of electromagnetic energy into a realignment of magnetic moments within an EMI absorber 110.

In some embodiments, the EMI absorber 110 exhibits better thermal conductivity than air. For example, spherical iron particles selected as an EMI absorber 110 because of their EMI-absorbing properties also offer some level of thermal conductivity. Generally, however, the thermal conductivity of the EMI absorbers 110 of comparable thicknesses is substantially less than the value of thermal conductivity offered by substantially non-EMI-absorbing thermal conductors 120, such as ceramic particles.

In general, the EMI absorber 110 is selected from the group consisting of electrically conductive material, metallic silver, carbonyl iron powder, SENDUST (an alloy containing 85% iron, 9.5% silicon and 5.5% aluminum), ferrites, iron silicide, magnetic alloys, magnetic flakes, and combinations thereof. In some embodiments, the EMI absorber 110 is a magnetic material. In one particular embodiment, the EMI absorber 110 has a relative magnetic permeability greater than about 3.0 at approximately 1.0 GHz, and greater than about 1.5 at 10 GHz.

The thermal conductor 120 includes a thermal impedance value substantially less than that of air. A low value of thermal impedance allows the thermal conductor 120 to efficiently conduct thermal energy. In general, the thermal conductor 120 is selected from the group consisting of aluminum nitride (AlN), boron nitride, iron (Fe), metallic oxides and combinations thereof. In some embodiments, the thermal conductor includes a ceramic material. In one particular embodiment, the thermal conductor 120 includes an Fe—AlN (40% and 20% by volume, respectively) having a thermal conductivity value greater than about 1.5 Watts/m-° C. An exemplary test report including a test procedure for measuring the thermal conductivity of a test sample, as well as measured thermal conductivity test results, is provided herein as Appendix A and incorporated herein in its entirety.

In general, the matrix material 130 is selected to have properties allowing it to conform to surface imperfections encountered in many heat-sink applications (for example, surface imperfections of the mating surfaces of either the electronic component or device and the heat sink). Other desirable properties of the matrix material 130 include an ability for the material 130 to accept and suspend a substantial volume of particles 110,120, (for example, up to about 60% by volume) without compromising the other advantageous properties of the matrix material 130, such as conformability, compliance, and resilience. Generally, the matrix material 130 is also substantially transparent to electromagnetic energy so that the matrix material 130 does not impede the absorptive action of the EMI absorbers 110. For example, a matrix material 130 exhibiting a relative dielectric constant of less than approximately 4 and a loss tangent of less than approximately 0.1 is sufficiently transparent to EMI. Values outside this range, however, are also contemplated.

Generally, the matrix material 130 can be selected as a solid, a liquid, or a phase-change material. Embodiments in which the matrix material 130 is a solid further include thermoplastic materials and thermoset materials. Thermoplastic materials can be heated and formed, then reheated and re-formed repeatedly. The shape of thermoplastic polymer molecules is generally linear, or slightly branched, allowing them to flow under pressure when heated above the effective melting point. Thermoset materials can also be heated and formed; however, they cannot be reprocessed (that is, made to flow under pressure when reheated). Thermoset materials undergo a chemical as well as a phase change when they are heated. Their molecules form a three-dimensional cross-linked network.

In some solid embodiments, the matrix material 130 is selected from the group consisting of elastomers, natural rubbers, synthetic rubbers, PDP, ethylene-propylene diene monomer (EPDM) rubber, and combinations thereof. In other embodiments the matrix material 130 includes a polymer. The matrix material 130 can also be selected from the group consisting of silicone, fluorosilicone, isoprene, nitrile, chlorosulfonated polyethylene (for example, HYPALON®), neoprene, fluoroelastomer, urethane, thermoplastics, such as thermoplastic elastomer (TPE), polyamide TPE and thermoplastic polyurethane (TPU), and combinations thereof.

Figure 2:
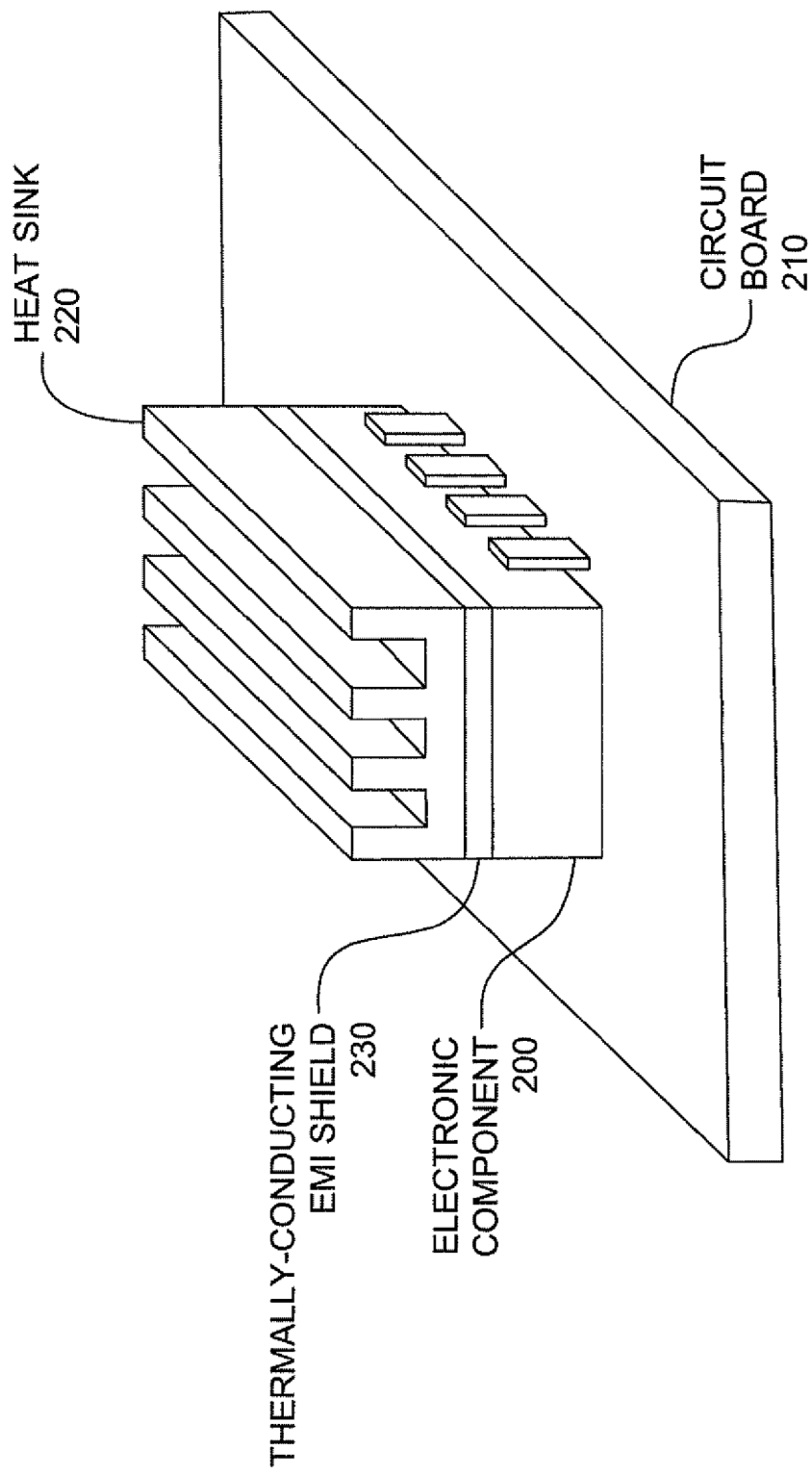
FIG. 2 is a schematic diagram depicting a perspective view of an exemplary application of a thermally conductive EMI absorber, such as the embodiment illustrated in FIG. 1.

Referring to FIG. 2, an exemplary application is illustrated in which an electronic component 200, shown mounted on a circuit board 210, is fitted with a heat sink 220. The electronic component 200 can be an electronic circuit (for example, a microcircuit, or "chip"). Alternatively, the electronic component 200 can be an electronic device, such as a packaged module including one or more electronic components (for example, mounted within a metallic housing, or "can"). In either instance, the electronic component 200 creates, as a byproduct of its electronic function, thermal energy that should be dissipated to ensure that the electronic component 200 continues to operate within its design parameters and is protected from physical damage due to overheating.

In general, a heat sink 220 is a device for dissipating heat from a host component 200. The heat sink 220 first absorbs heat from the host component 200 through conduction. The heat sink 220 then dissipates the absorbed heat through convection to the surrounding air. The particular type or form of heat sink 220 selected is not critical. Rather, the heat sink 220 can be any one of a numerous variety of commercially available heat sinks, or even a custom designed heat sink.

The thermal EMI shield 230 facilitates thermal conduction from the component 200 to the heat sink 220. Generally, the thickness of the thermal EMI shield 230 (the dimension between the protected component 200 and the heat sink) is less than a predetermined maximum value. For example, in one embodiment, the thermal EMI shield 230 has a maximum thickness less than approximately 0.18 inch. Furthermore, the thickness of the thermal EMI shield 230 is generally greater than a predetermined minimum value. If the thermal EMI shield is too thin, an insufficient volume of EMI absorbing material will be provided to sufficiently absorb EMI from the component 200. For example, in one embodiment, the thermal EMI shield 230 has a minimum thickness greater than approximately 0.01 inch.

In one exemplary configuration, a thermal EMI shield 230 having a thickness of 0.125 inch, exhibits an attenuation of at least about 5 dB in a frequency range from about 5 GHz up to at least about 18 GHz. In another exemplary configuration, a thermal EMI shield 230 having a thickness of 0.02 inch, exhibits an attenuation of at least about 3 dB for a frequency range extending upward from about 10 GHz. In another exemplary configuration, a thermal EMI shield 230 having a thickness of 0.04 inch, exhibits an attenuation of at least about 10 dB in a frequency range from about 9 GHz up to at least about 15 GHz and an attenuation of at least about 6 dB in a frequency range extending upward from about 15 GHz. In yet another exemplary configuration, a thermal EMI shield 230 having a thickness of 0.060 inch, ±0.005 inch, exhibits an attenuation of at least about 5 dB in a frequency range extending upward from about 4 GHz, having a greater attenuation of at least about 10 dB in a frequency range from about 6 GHz up to at least about 10 GHz. Exemplary values of the complex (real and imaginary) relative permittivity ($\in_r$) and complex (real and imaginary) relative magnetic permeability ($\mu_r$) for a nitrile rubber compound are tabulated and provided herein as Appendix B, incorporated herein in its entirety.

Figure 3A:
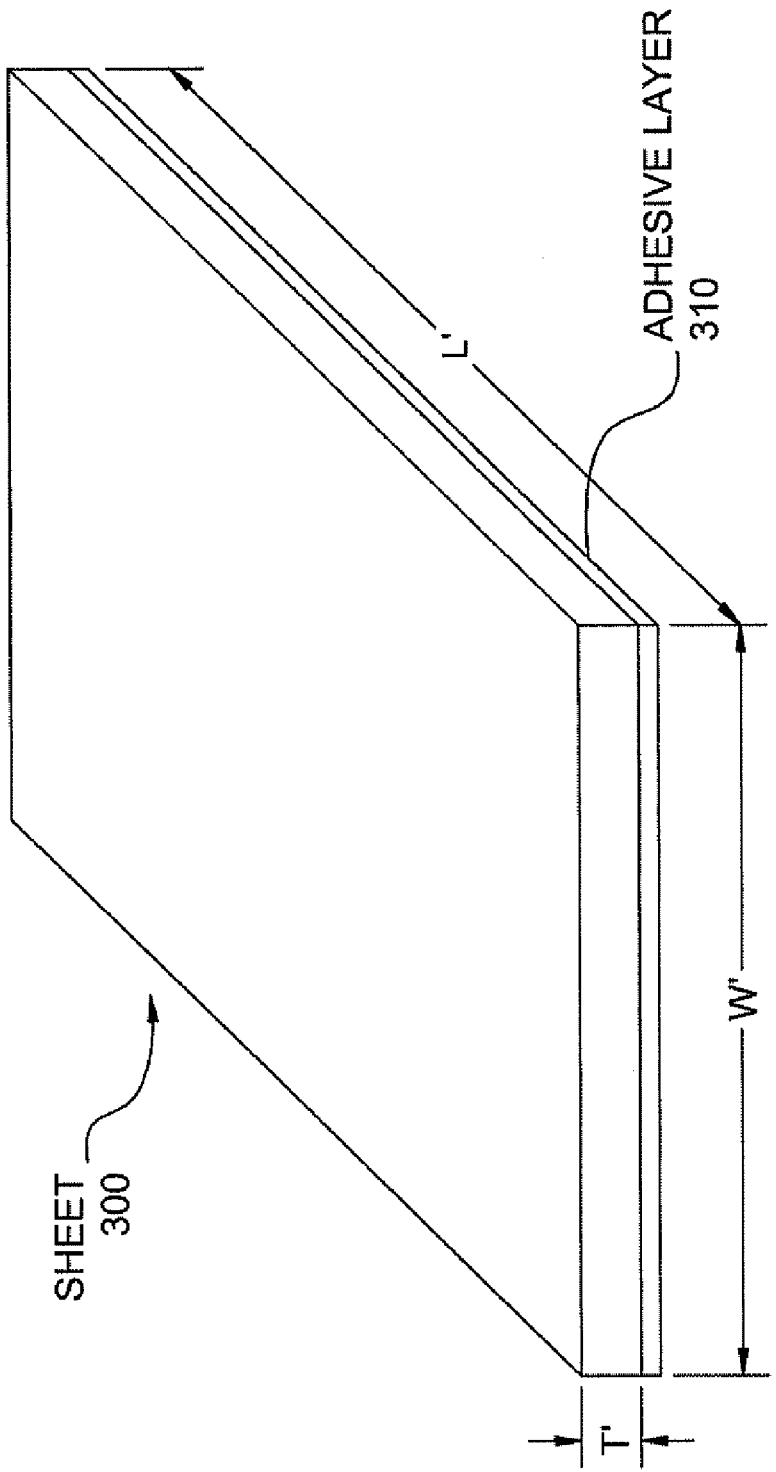
FIGS. 3A and 3B are schematic diagrams depicting perspective views of alternative embodiments of a thermally conductive EMI absorber formed as a sheet and as a rollable tape, respectively.

Referring to FIG. 3A, a thermal EMI shield is illustrated in a sheet configuration. Generally, the thermal EMI shield can be formed as a sheet 300. The sheet 300 includes a length (L') a width (W') and a thickness (T'). In one embodiment, the length and width may be selected according to the dimensions of a particular application, such as the length and width of an electronic component 200 to which a heat sink 220 will be applied. In another embodiment, the sheet 300 can be fabricated in a predetermined size, such as a length of 26 inches, a width of 6 inches, and a thickness of either 0.030 inch or 0.060 inch. Any size, however, is contemplated.

Yet other embodiments of a thermal EMI shield 100 may include a sheet 300 as just described, further including an adhesive layer 310. The adhesive layer 310 a may be a thermoconductive adhesive to preserve the overall thermal conductivity. The adhesive layer 310 can be used to affix the heat sink 220 to the electronic component 200. In some embodiments, the sheet 300 includes a second adhesive layer, the two layers facilitating the adherence of the heat sink 220 to the electronic component 200. In some embodiments, the adhesive layer 310 is formulated using a pressure-sensitive, thermally-conducting adhesive. The pressure-sensitive adhesive (PSA) may be generally based on compounds including acrylic, silicone, rubber, and combinations thereof. The thermal conductivity is enhanced, for example, by the inclusion of ceramic powder.

Figure 3B:
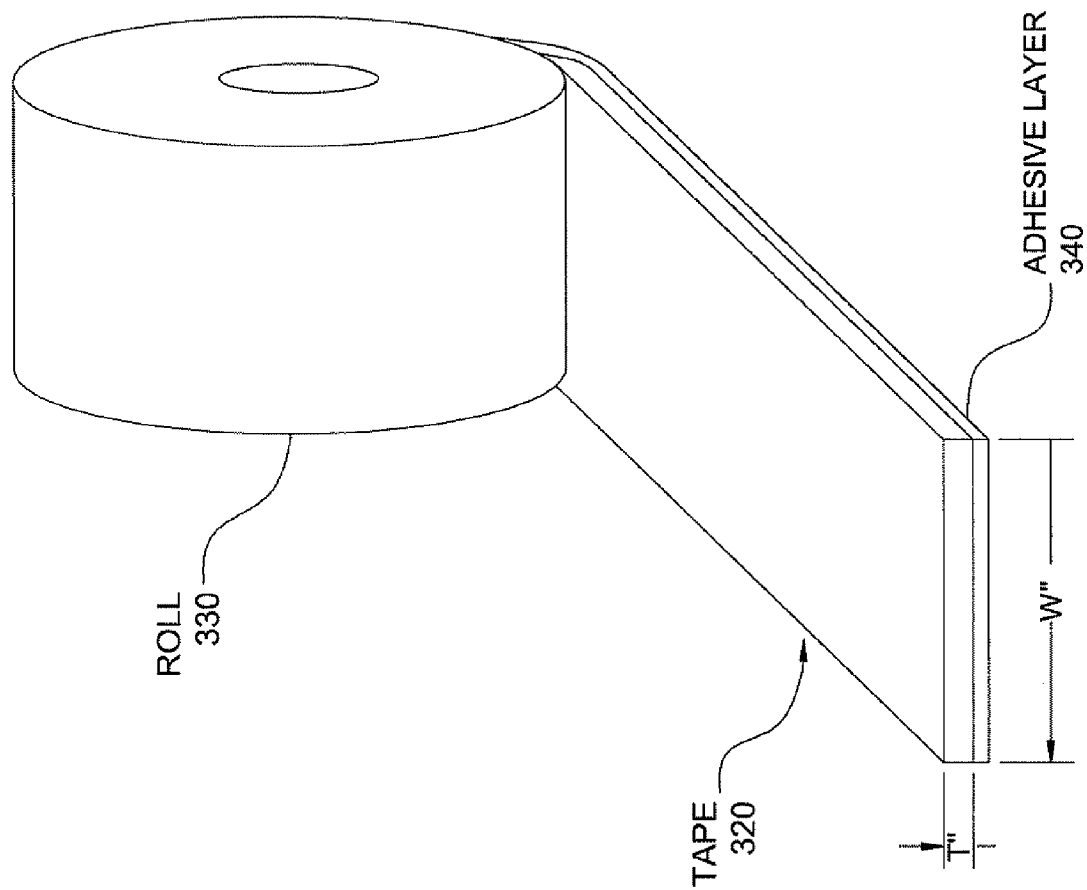

In an alternative embodiment, referring now to FIG. 3B, the thermal EMI shield may be formed as a tape 320. The tape 320, for example, can be stored on a roll 330, similar in form to a conventional roll of adhesive-backed tape. The tape 320 generally exhibits construction and composition features similar to those already described in relation to the sheet 300 of FIG. 3A. Similar to the sheet 300, the tape 320 includes a second width (W") and a second thickness (T"). In general, the length for a tape roll embodiment is arbitrary, because the length of the tape 320 is substantially longer than any individual application. Accordingly, lengths of tape 320 suitable for intended applications can be separated (for example, "cut") from the roll 330. Again, similar to the previously described sheet 300, the tape 320 can include a first adhesive layer 340. The tape 320 can also include a second adhesive layer, similar to two-sided fastening tape.

Figure 4:
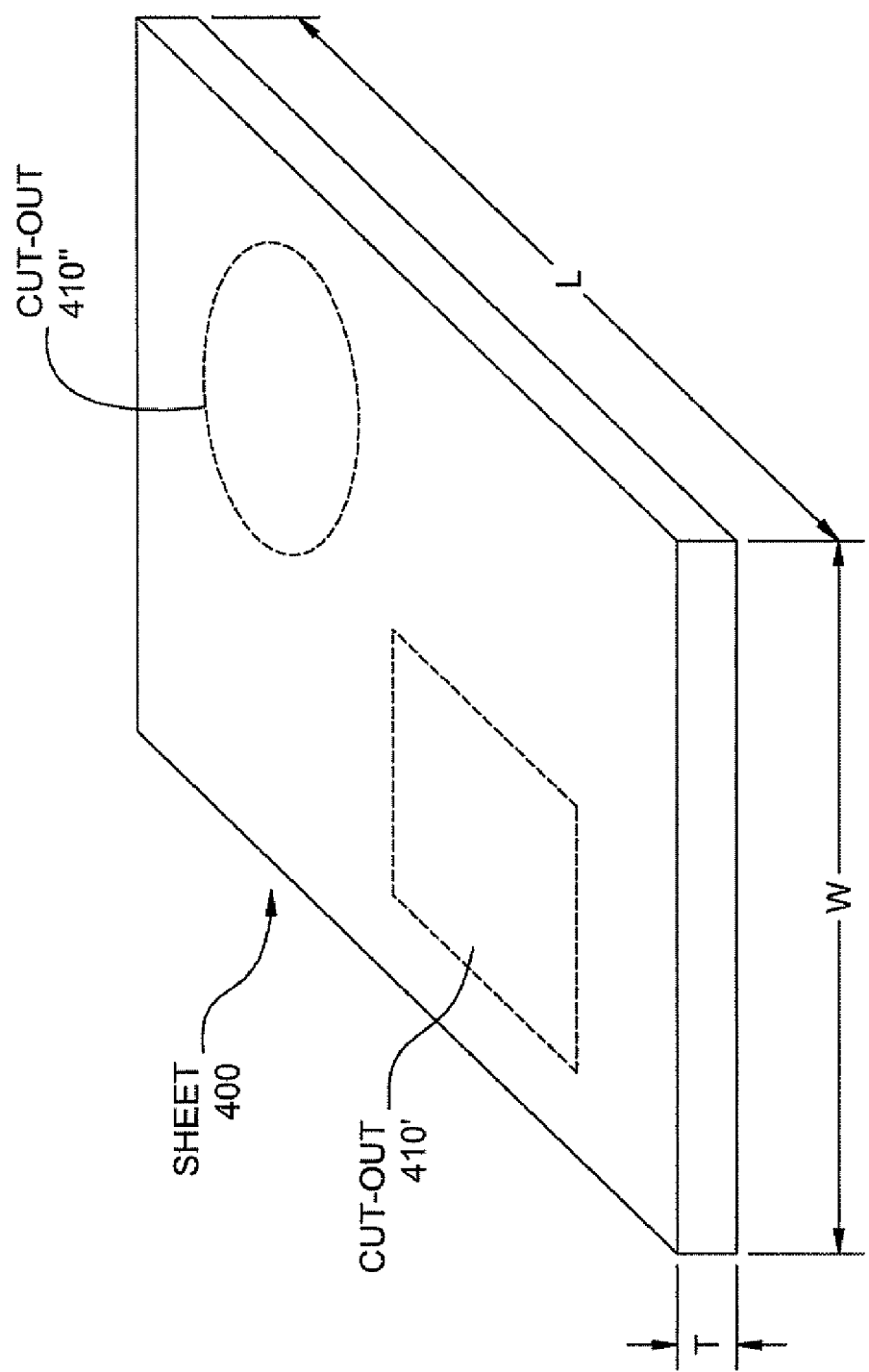
FIG. 4 is a schematic diagram depicting an alternative embodiment of the thermally conductive EMI absorber depicted in FIG. 1, in which desired shapes are cut, for example, from the sheet of FIG. 3A.

Referring now to FIG. 4, an alternative embodiment of a thermal EMI shield 100 configured as a sheet 400 is illustrated. In this embodiment, desired application shapes, such as a rectangle 410' and an ellipse 410" (generally 410) can be die-cut from the sheet 400, thereby yielding thermal EMI absorbers 100 of any desired two-dimensional shape. Accordingly, the sheet 400 can be die-cut to produce the desired outlines of the application shapes 410. Alternatively, the desired outlines of the application shapes 410 can be custom cut from the blank sheet 300 shown in FIG. 3A.

Figure 5:
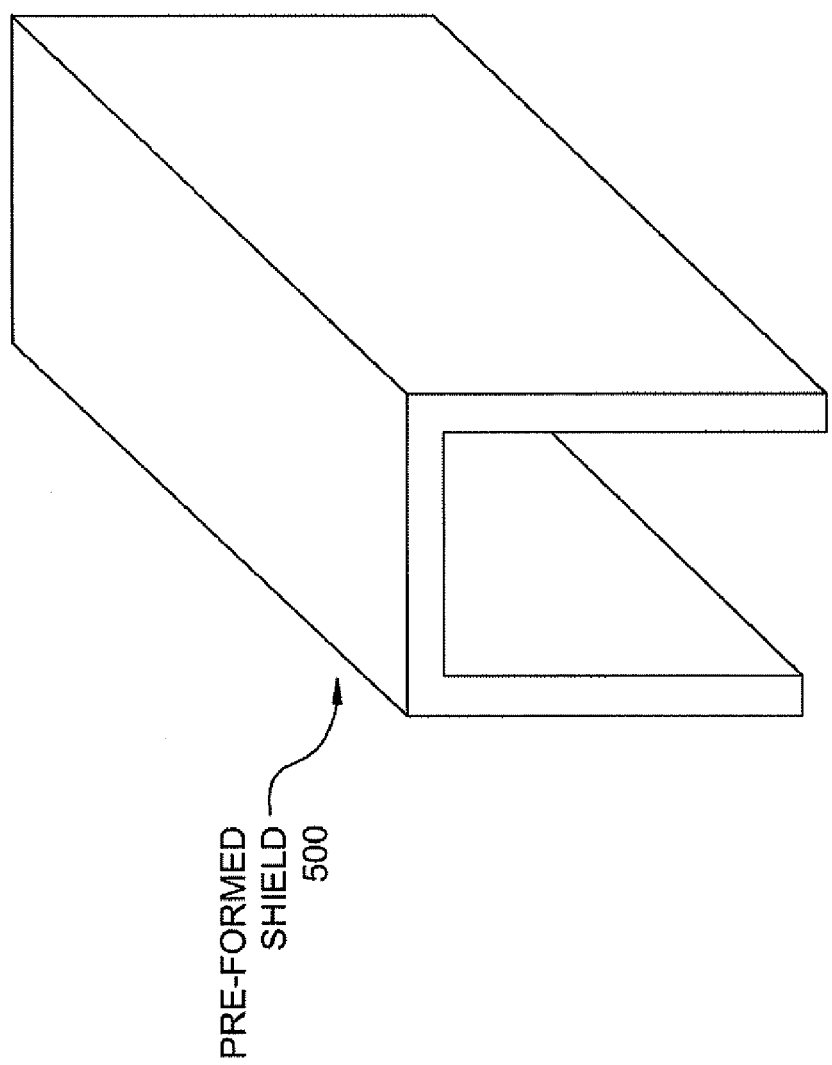
FIG. 5 is a schematic diagram depicting a perspective view of an alternative embodiment of the thermally conductive EMI absorber depicted in FIG. 1, in which the shield is pre-formed according to a predetermined shape.

In yet another embodiment, the thermal EMI shield material may be preformed in any desired shape. Referring now to FIG. 5, a preformed shield 500 in a non-planar application is illustrated. The thermal EMI shield may be molded or extruded in any desired shape, such as the rectangular trough shown, a cylindrical trough, and semi-circular trough. Such non-planar thermal EMI shields 500 can be used in connection with non-planar electrical components 200, such as cylindrical devices or components (for example, "cans").

Figure 6:
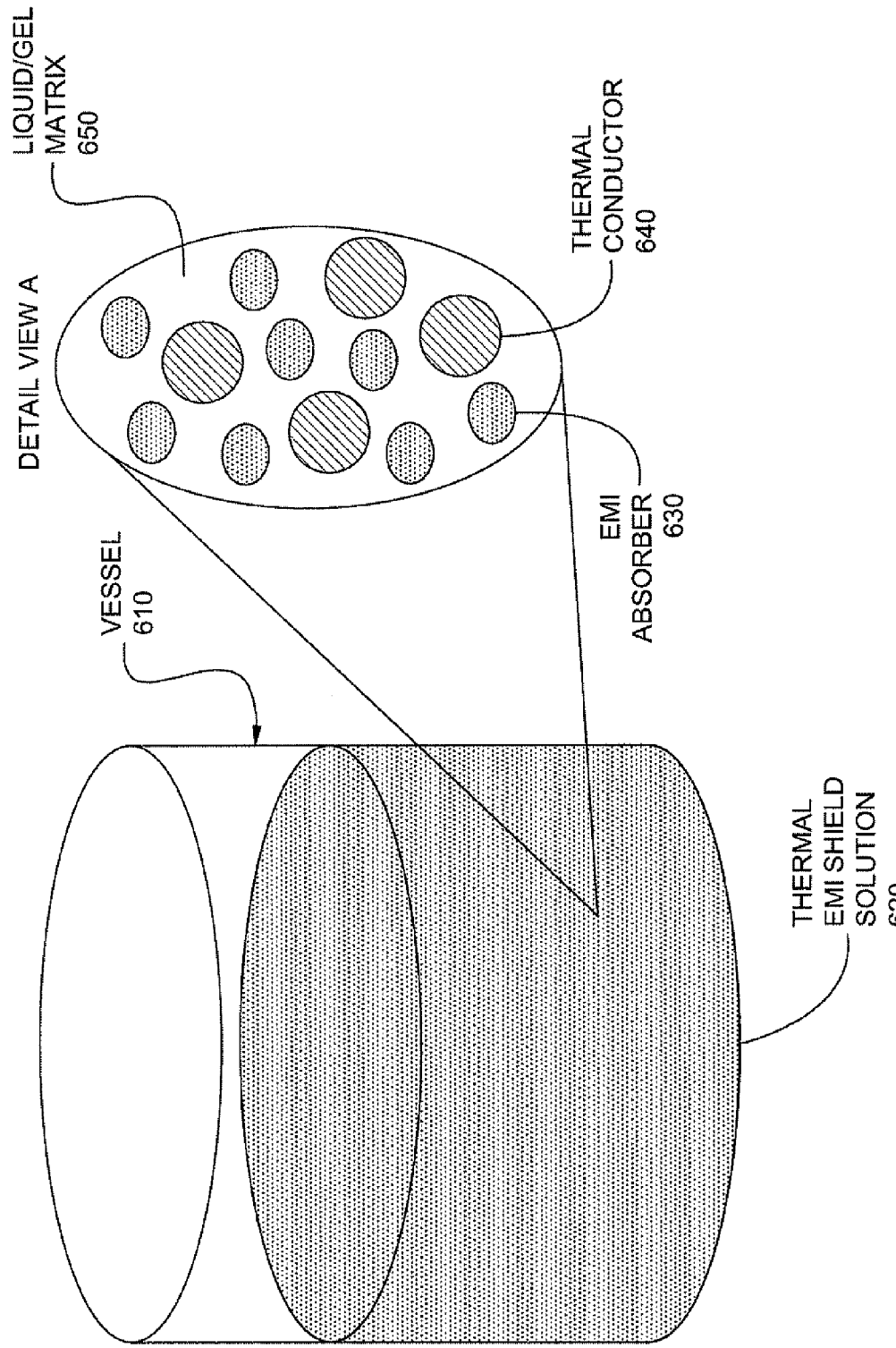
FIG. 6 is a schematic diagram of an alternative embodiment of a thermally conductive EMI absorber in a flowable form, such as a liquid.

Referring to FIG. 6, an embodiment of a liquid thermal EMI shield 600 is illustrated. In general, a vessel 610 is shown holding a liquid thermal EMI shield solution 620. A portion of the solution 620 "A" is illustrated in greater detail in an insert labeled "Detail View A." The detail view illustrates that the solution 620 includes EMI absorber particles 630 and thermal conductor particles 640, each suspended within a liquid matrix 650. Generally, the attributes of the particles 630,640 are similar to the attributes of the corresponding particles 110,120 described in relation to FIG. 1. Similar to the matrix described in relation to FIG. 1, the liquid matrix 650 is substantially transparent to electromagnetic radiation. The liquid matrix 650 can be formed as a liquid that may be painted onto an applicable surface to be treated. Alternatively, the liquid matrix 650 can be formed as a gel, such as grease, or as a paste or pour-in-place compound. In some embodiments, the liquid thermal EMI shield 600 can be applied to the intended surface by painting, spraying, or other suitable method. The matrix material may also be a liquid selected from the group consisting of silicones, epoxies, polyester resins and combinations thereof.

In one embodiment, the matrix 130 illustrated in FIG. 1 is a suitably selected phase-change material having properties of both a solid and a liquid. At ambient room temperatures, the phase-change material behaves as a solid offering ease of handling and storage. The phase-change material, however, exhibits a reflow temperature at or below the equipment operating temperature thereby enabling a "wetting action." The matrix 130 reflows allowing the EMI-absorbing particles 110 and the thermally conductive particles 120 of the composite material 100 to flow into any gaps, such as those caused by surface imperfections.

Figure 7:
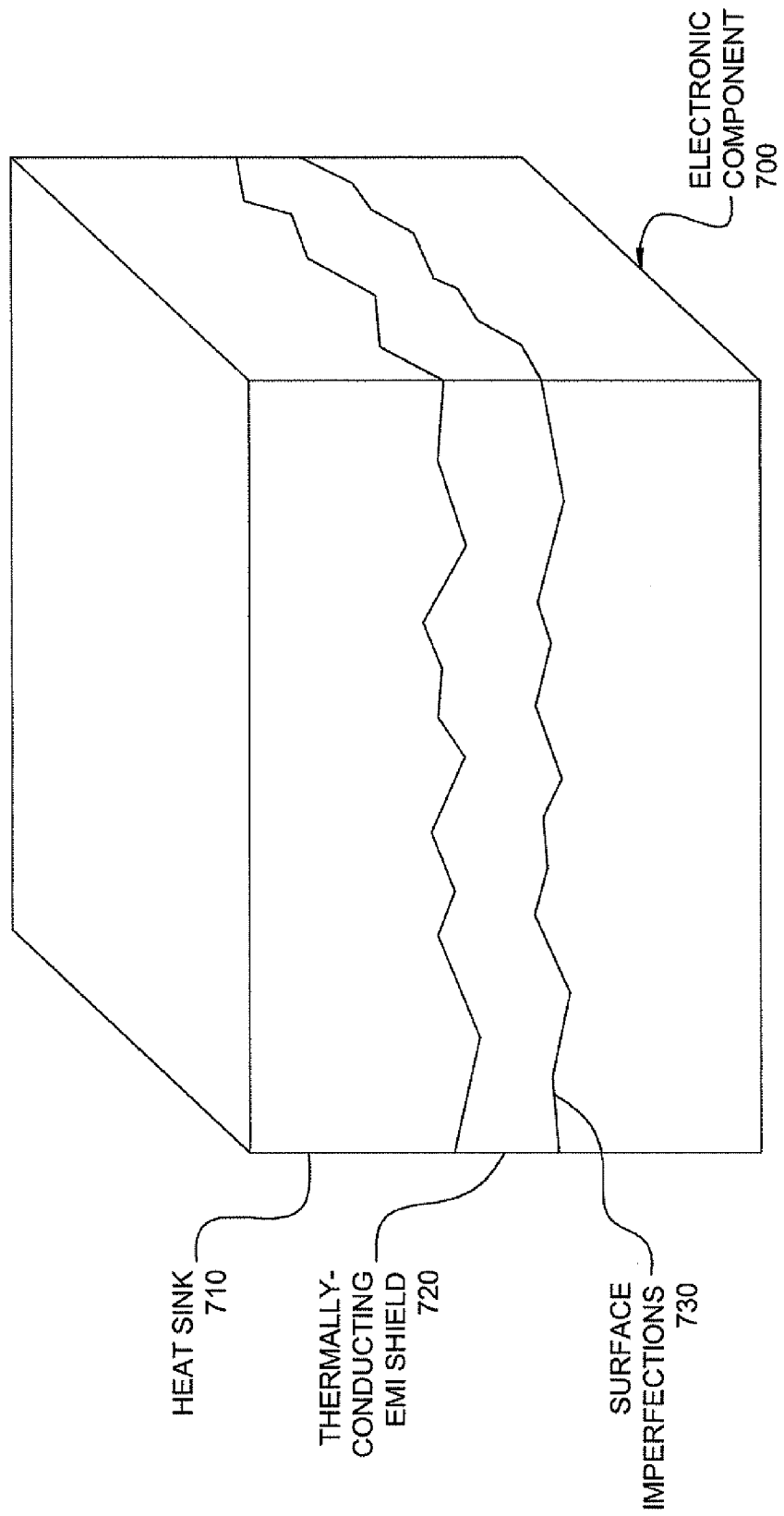
FIG. 7 is a schematic diagram depicting a perspective view of an exemplary application of a flowable, thermally conductive EMI absorber, such as the embodiment illustrated in FIG. 6.

Referring to FIG. 7, a close-up detail of a cross-sectional view of an electronic component 700, a heat sink 710, and a thermally conducting EMI shield 720 is illustrated. Also shown are the surface imperfections 730 of each or both of the component 700 and heat sink 710. The surface imperfections 730 are portrayed in an exaggerated manner for the purpose of illustration. With an ability to flow into surface imperfections 730, a matrix 650 formulated as a liquid, or phase-change material removes air gaps, thereby minimizing the thermal impedance between the device 700 and an associated heat sink 710. The overall effect of removing air gaps reduces the thermal impedance between the electrical component 700 and the heat sink 710, leading to improved heat transfer efficiency. The matrix material may be a mixture of a paraffin wax having a melting point of approximately 51° C. and a 28% ethylene-vinyl acetate copolymer having a melting point of approximately 74° C. For example, a mixture of ninety-five parts by weight of the paraffin wax and five parts by weight of the ethylene-vinyl acetate copolymer may be used. Alternatively, a mixture of twenty-five parts by weight of the paraffin wax and six parts by weight of the ethylene-vinyl acetate copolymer may be used. Alternatively still, the matrix material may be a synthetic wax having a melting point of approximately 100° C. and a molecular weight of approximately 1000. Such a wax is of a type known as a Fischer-Tropsch wax.

Figure 8:
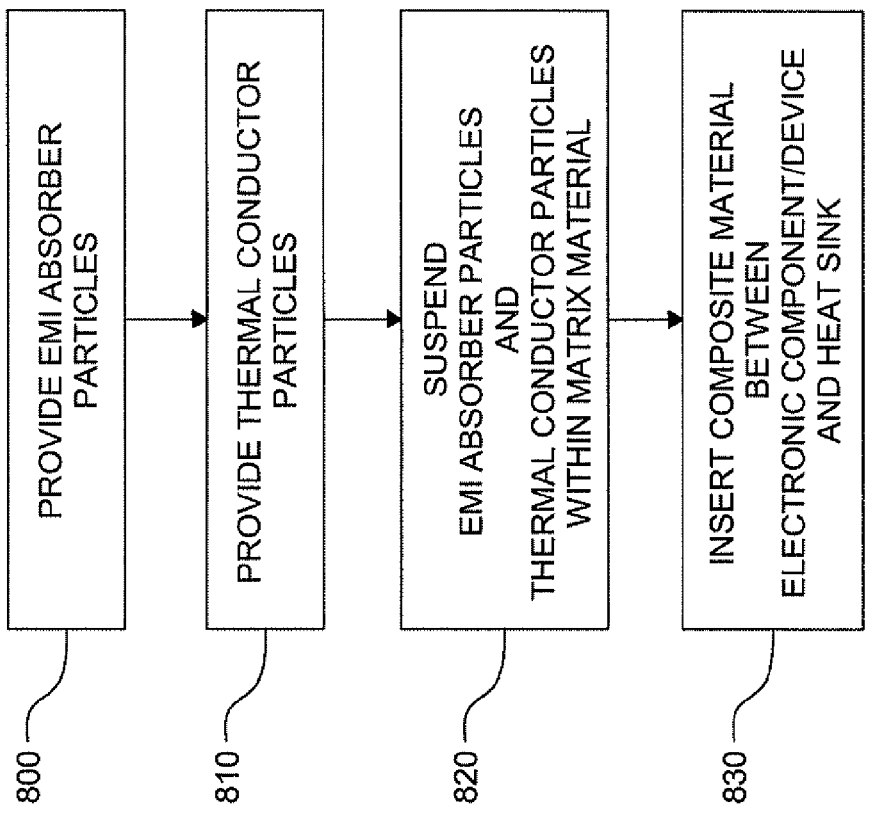
FIG. 8 is a flow diagram depicting an embodiment of a process for preparing a thermally conductive EMI absorber, such as the embodiment illustrated in FIG. 1.

Referring to FIG. 8, a flow diagram is illustrated depicting a process of preparing a thermally-conductive EMI absorber 100, such as the embodiments illustrated in either FIG. 1 or FIG. 6. EMI absorber particles 110,630 are provided at step 800. Thermally conductive particles 120,640 are also provided at step 810. The EMI absorber particles 110,630 and thermally conducting particles 120,640 are combined and suspended within either a solid matrix material 130, or a liquid matrix material 650. Once prepared, the composite thermal EMI shield 100,600 is applied between an electronic component 200,700 and a heat sink 220,710 at step 830.

Having shown exemplary and preferred embodiments, one skilled in the art will realize that many variations are possible within the scope and spirit of the claimed invention. It is therefore the intention to limit the invention only by the scope of the claims, including all variants and equivalents.

APPENDIX A

Test Report

Scope:
This report summarizes the thermal conductivity testing of multiple electromagnetic-energy-absorbing materials including a thermally conductive filler to also provide good thermal conductivity.

Part Description:
Three test samples were prepared and tested for thermal performance. Each of the samples consisted of iron (Fe)-filled elastomeric materials formulated to absorb electromagnetic surface waves. Some specific details for the test samples are listed below in Table 1.

TABLE 1

| Test Samples | |
| --- | --- |
| Sample No. | Test Sample Description |
| 1 | 50% Fe by volume in isoprene, test slab thickness of 30, 60, 90 and 125 mils. |

TABLE 1-continued

Test Samples

| Sample No. | Test Sample Description |
|---|---|
| 2 | 41.5% Fe by volume in silicone, test slab thickness of 20, 30, 60 and 100 mils. |
| 3 | 40% Fe plus 20% aluminum nitride (AlN) by volume in silicone, test slab thickness of 30, 60, 90 and 120 mils. |

Test Procedure:

Thermal resistance testing was conducted in accordance with in internal test procedure and in accordance with ASTM specification D5470. The test samples were first die-cut into 1-inch-diameter circles to match the size of the thermal impedance probes. All of the thermal resistance measurements were made at 50° C., and 100 psi.

Figure 9:
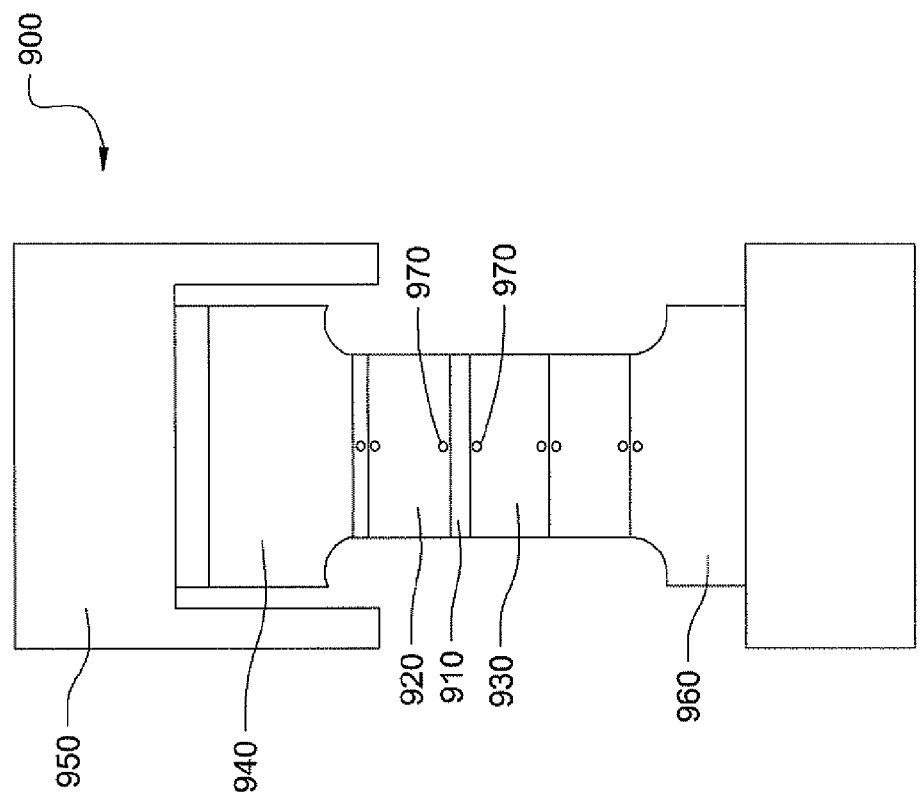
FIG. 9 is a schematic plan view of a test fixture used to measure the thermal conductivity of the thermally conductive EMI shield of the present invention.

The test fixture 900 is shown in FIG. 9. The test sample 910 is placed between two polished metal plates 920,930 that are stacked within the test assembly 900 as shown in FIG. 9. The heat is input from the heater plate 940, which is protected from heat loss in all directions other than the testing direction by applying the same temperature to a guard heater 950 that is located above and around the heater plate 940. An upper meter block 920 is located directly below the heater 940 and is followed by the test sample 910 find then a lower meter block 930. Heat is drawn out from the bottom of the test stack with a water-cooled chiller plate 960. Thermocouples 970 embedded in the meter blocks 920,930 are used to extrapolate the surface temperature on each side of the test sample 910. This is done using a SRM 1462 reference material that has a thermal conductivity much greater than that of the test sample.

During the test the sample is compressed at a constant pressure using a pneumatic cylinder. The stack is then permitted to reach a steady state at which point the thermal resistance of the sample is calculated. Once the thermal resistance of several thickness of material (nominally five) is measured and plotted the thermal conductivity is calculated as the inverse of the slope of the least squares best fit line through this data.

Test Results:

The thermal conductivity of the three absorbing test samples is shown in Table 2. The two standard absorbing materials, Sample No. 1 and Sample No. 2, have very similar thermal conductivities (approximately 1.0 Watts/m–° C.), whereas the third absorber material, Sample No. 3, has a substantially higher thermal conductivity (approximately 1.5 Watts/m–° C.).

TABLE 2

Thermal Conductivity

| Test Sample | Thermal Conductivity (Watts/m-° C.) | Standard Deviation |
|---|---|---|
| Sample No. 1 | 0.986 | 0.0632 |
| Sample No. 2 | 1.022 | 0.0959 |
| Sample No. 3 | 1.511 | 0.0637 |

APPENDIX B

NITRILE RUBBER (40%)

| Frequency (GHz) | $\mu_r$ | $\mu_i$ | $\in_r$ | $\in_i$ |
|---|---|---|---|---|
| 0.915 | 4 | −1.77 | 12.277 | −0.251 |
| 1.15 | 4 | −1.77 | 12.277 | −0.251 |
| 2 | 3.4 | −1.74 | 12.277 | −0.251 |
| 2.245 | 3.29 | −1.735 | 12.277 | −0.251 |
| 3 | 2.95 | −1.72 | 12.277 | −0.251 |
| 4 | 2.58 | −1.67 | 12.277 | −0.251 |
| 5 | 2.219 | −1.624 | 12.277 | −0.251 |
| 6 | 2.05 | −1.58 | 12.277 | −0.251 |
| 7 | 1.88 | −1.55 | 12.277 | −0.251 |
| 8 | 1.65 | −1.52 | 12.277 | −0.251 |
| 9 | 1.5 | −1.48 | 12.277 | −0.251 |
| 9.5 | 1.45 | −1.43 | 12.277 | −0.251 |
| 10 | 1.39 | −1.4 | 12.277 | −0.251 |
| 11 | 1.34 | −1.36 | 12.277 | −0.251 |
| 12 | 1.27 | −1.32 | 12.277 | −0.251 |
| 13 | 1.201 | −1.273 | 12.277 | −0.251 |
| 14 | 1.18 | −1.24 | 12.277 | −0.251 |
| 15 | 1.14 | −1.21 | 12.277 | −0.251 |
| 15.5 | 1.1 | −1.18 | 12.277 | −0.251 |
| 16 | 1.057 | −1.147 | 12.277 | −0.251 |
| 17 | 1.04 | −1.125 | 12.277 | −0.251 |
| 18 | 1.03 | −1.1 | 12.277 | −0.251 |
| 20 | 0.854 | −0.955 | 12.277 | −0.251 |
| 25 | 0.68 | −0.74 | 12.277 | −0.251 |
| 30 | 0.6 | −0.54 | 12.277 | −0.251 |
| 35 | 0.533 | −0.34 | 12.277 | −0.251 |
| 40 | 0.461 | −0.165 | 12.277 | −0.251 |

What is claimed is:

1. A thermally conductive composite material for reducing electromagnetic emissions generated by an electronic device, said thermally conductive composite material comprising:
   a thermally conductive material in particulate form; and
   an electromagnetic-energy-absorptive material in particulate form,
   said thermally conductive material and said electromagnetic-energy-absorptive material being suspended within a polymeric base material, said polymeric base material being substantially transparent to electromagnetic energy, said polymeric base material comprising a phase-change material and up to 19.35% by weight of ethylene-vinyl acetate, the phase-change material comprising a paraffin wax or a synthetic wax, wherein the phase-change material has a reflow temperature that allows the thermally conductive material in particulate form that is suspended within the polymeric base material to flow into gaps and thereby at least reduce thermal impedance,
   wherein said thermally conductive composite material is configured such that when placed between an electronic device and a proximate structure, said thermally conductive material is operable for facilitating transfer of thermal energy from said electronic device and said electromagnetic-energy-absorptive material is operable for reducing electromagnetic emissions generated by the device, and
   wherein the electromagnetic-energy-absorptive material includes carbonyl iron.

2. A thermally conductive composite material as claimed in claim 1 wherein at least one of said thermally conductive material and said electromagnetic-energy-absorptive material comprises particles in the form of granules having a spheroid shape.

3. A thermally conductive composite material as claimed in claim 2 wherein the thermally conductive material comprises microspheres.

4. A thermally conductive composite material as claimed in claim 1 wherein said thermally conductive material is selected from the group consisting of aluminum nitride, boron nitride, iron, metallic oxides and combinations thereof.

5. A thermally conductive composite material as claimed in claim 1 wherein said thermally conductive material is a ceramic material.

6. A thermally conducting composite material as claimed in claim 1 wherein said polymeric base material has a relative dielectric constant of less than approximately 4 and a loss tangent of less than approximately 0.1.

7. A thermally conductive composite material as claimed in claim 1 wherein said polymeric base material is selected from the group consisting of elastomers, natural rubbers, synthetic rubbers, PDP, EPDM rubber, and combinations thereof.

8. A thermally conductive composite material as claimed in claim 1 wherein said polymeric base material is selected from the group consisting of silicone, fluorosilicone, isoprene, nitrile, chlorosulfonated polyethylene, neoprene, fluoroelastomer, urethane, thermoplastics, thermoplastic elastomer (TPE), polyamide TPE, thermoplastic polyurethane (TPU), and combinations thereof.

9. A thermally conductive composite material as claimed in claim 1 wherein said polymeric base material is a solid material selected from the group consisting of thermoplastic and thermosetting materials.

10. A thermally conductive composite material as claimed in claim 1 wherein said polymeric base material is a liquid.

11. A thermally conductive composite material as claimed in claim 10 wherein said liquid is selected from the group consisting of silicones, epoxies, polyester resins, and combinations thereof.

12. A thermally conductive composite material as claimed in claim 1 wherein said polymeric base material comprises a phase-change material configured to exist in a solid phase at ambient room temperature and transition to a liquid phase at a reflow temperature.

13. A thermally conductive composite material as claimed in claim 1 wherein said polymeric base material comprises a mixture of a paraffin wax and an ethylene-vinyl acetate copolymer.

14. A thermally conductive composite material as claimed in claim 1 wherein said polymeric base material comprises a synthetic wax having a melting point of approximately 100° C. and a molecular weight of approximately 1000.

15. A thermally conductive composite material as claimed in claim 1 wherein said electromagnetic-energy-absorptive material has a relative magnetic permeability greater than about 3.0 at approximately 1.0 GHz and greater than about 1.5 at 10GHz.

16. A thermally conductive composite material as claimed in claim 1 wherein said composite material is in the form of a sheet having a thickness greater than approximately 0.01 inches.

17. A thermally conductive composite material as claimed in claim 1 wherein said composite material is in the form of a sheet having a thickness less than approximately 0.18 inches.

18. A thermally conductive composite material as claimed in claim 1 wherein said composite material is in the form of a sheet, and further comprises an adhesive on at least one side of said sheet.

19. A thermally conductive composite material as claimed in claim 18 wherein said adhesive is a thermoconductive adhesive.

20. A thermally conductive composite material as claimed in claim 18 wherein said adhesive is a pressure-sensitive, thermally conductive adhesive.

21. A thermally conductive composite material as claimed in claim 18 wherein said adhesive is based on compounds selected from the group consisting of acrylics, silicones, rubbers and combinations thereof.

22. A thermally conductive composite material as claimed in claim 18 wherein said adhesive further comprises a ceramic powder.

23. A thermally conductive composite material as claimed in claim 1 wherein the electromagnetic-energy-absorptive material includes generally ellipsoidal carbonyl iron granules.

24. A thermally conductive composite material as claimed in claim 1 wherein the electromagnetic-energy-absorptive material is entirely carbonyl iron.

25. A thermally conductive composite material as claimed in claim 1 wherein:
the electromagnetic-energy-absorptive material exhibits better thermal conductivity than air; and
the thermally conductive material exhibits greater thermal conductivity than the electromagnetic-energy-absorptive material, the thermally conductive material having a thermal impedance value substantially less than that of air.

26. A thermally conductive composite material as claimed in claim 1 wherein the composite material includes about 60 percent by volume of the thermally conductive material and the electromagnetic-energy-absorptive material.

27. A thermally conductive composite material as claimed in claim 1 wherein:
the thermally conductive material in particulate form comprises granules spaced-apart from each other;
the electromagnetic-energy-absorptive material in particulate form comprises granules spaced apart from each other and spaced-apart from the granules of the thermally conductive material; and
the composite material is electrically non-conductive.

28. A thermally conductive composite material as claimed in claim 1 wherein said polymeric base material comprises a mixture of 25 parts by weight of a paraffin wax and 6 parts by weight of an ethylene-vinyl acetate copolymer.

29. A thermally conductive composite material as claimed in claim 1 wherein said polymeric base material comprises a mixture of 95 parts by weight of a paraffin wax and 5 parts by weight of an ethylene-vinyl acetate copolymer.

30. A thermally conductive composite material as claimed in claim 1 wherein said polymeric base material comprises a mixture of a paraffin wax in an amount of about 80.65% by weight and an ethylene-vinyl acetate copolymer in an amount of about 19.35% by weight.

31. A thermally conductive composite material as claimed in claim 1 wherein said polymeric base material comprises a mixture of a paraffin wax in an amount of about 95% by weight and an ethylene-vinyl acetate copolymer in an amount of about 5% by weight.

32. A thermally conductive composite material as claimed in claim 1 wherein said polymeric base material comprises a mixture of a paraffin wax in an amount of between about 80.65% and about 95% by weight and an ethylene-vinyl acetate copolymer in an amount of between about 5% and about 19.35% by weight.

33. A thermally conductive composite material as claimed in claim 1 wherein said polymeric base material comprises a mixture of paraffin wax having a melting point of approximately 51 degrees Celsius and a 28% ethylene-vinyl acetate copolymer having a melting point of approximately 74 degrees Celsius.

34. An electronic component comprising an integrated circuit, a heat sink, and the composite material of claim 1.

35. A method of reducing electromagnetic emissions produced by a device comprising:
  combining a thermally conductive material in particulate form with an electromagnetic-energy-absorptive material in particulate form, the electromagnetic-energy-absorptive material including carbonyl iron;
  suspending the combined thermally conductive material and electromagnetic-energy-absorptive material in a polymeric base material comprising a phase-change material and up to 19.35% by weight of ethylene-vinyl acetate, the phase-change material comprising a paraffin wax or a synthetic wax; and
  placing the combined thermally conductive material and electromagnetic-energy-absorptive material suspended in the polymeric base material between said device and a proximate structure, wherein the phase-change material has a reflow temperature that allows the thermally conductive material in particulate form suspended within the polymeric base material to flow into gaps and thereby at least reduce thermal impedance between the device and the proximate structure.

36. The method of claim 35 wherein the proximate structure comprises a heat sink.

37. The method of claim 35 wherein said device comprises an integrated circuit.

38. The method of claim 35 wherein:
  the combined thermally conductive material and electromagnetic-energy-absorptive material suspended in the polymeric base comprise a liquid solution; and
  placing comprises applying the liquid solution onto a surface of at least one of the device and the proximate structure having one or more surface imperfections, and allowing the liquid solution to flow into the one or more surface imperfections.

39. The method of claim 35 wherein:
  the combined thermally conductive material and electromagnetic-energy-absorptive material suspended in the polymeric base comprise a liquid solution; and
  placing comprises spraying or painting the liquid solution onto a surface of at least one of the device and the proximate structure.

40. The method of claim 35 wherein said polymeric base material comprises a mixture of 25 parts by weight of a paraffin wax and 6 parts by weight of an ethylene-vinyl acetate copolymer.

41. The method of claim 35 wherein said polymeric base material comprises a mixture of 95 parts by weight of a paraffin wax and 5 parts by weight of an ethylene-vinyl acetate copolymer.

42. A thermally conductive composite material as claimed in claim 1 wherein:
  the composite material is in the form of a sheet having a thickness of about 0.125 inch and exhibits an attenuation of at least about 5 dB in a frequency range from about 5 GHz up to at least about 18 GHz; or
  the composite material is in the form of a sheet having a thickness of about 0.02 inch and exhibits an attenuation of at least about 3 dB for a frequency range extending upward from about 10 GHz; or
  the composite material is in the form of a sheet having a thickness of about 0.04 inch and exhibits an attenuation of at least about 10 dB in a frequency range from about 9 GHz up to at least about 15 GHz and an attenuation of at least about 6 dB in a frequency range extending upward from about 15 GHz; or
  the composite material is in the form of a sheet having a thickness of about 0.060 inch and exhibits an attenuation of at least about 5 dB in a frequency range extending upward from about 4 GHz, having a greater attenuation of at least about 10 dB in a frequency range from about 6 GHz up to at least about 10 GHz.

43. A thermally conductive composite material as claimed in claim 1 wherein said polymeric base material comprises a mixture of a paraffin wax and an ethylene-vinyl acetate copolymer, including an amount of the paraffin wax within a range of from about 25 parts by weight paraffin wax to 6 parts by weight ethylene-vinyl acetate copolymer, up to about 95 parts by weight paraffin wax and 5 parts by weight of ethylene-vinyl acetate copolymer.

* * * * *

UNITED STATES PATENT AND TRADEMARK OFFICE
CERTIFICATE OF CORRECTION

PATENT NO.        : 7,608,326 B2                                              Page 1 of 1
APPLICATION NO. : 10/531890
DATED             : October 27, 2009
INVENTOR(S)       : Richard Norman Johnson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 614 days.

Signed and Sealed this

Twelfth Day of October, 2010

David J. Kappos
*Director of the United States Patent and Trademark Office*